(12) United States Patent
Johnson et al.

(10) Patent No.: US 6,515,888 B2
(45) Date of Patent: Feb. 4, 2003

(54) LOW COST THREE-DIMENSIONAL MEMORY ARRAY

(75) Inventors: Mark G. Johnson, Los Altos, CA (US); Thomas H. Lee, Cupertino, CA (US); Vivek Subramanian, Redwood City, CA (US); P. Michael Farmwald, Portola Valley, CA (US); N. Johan Knall, Sunnyvale, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/928,969

(22) Filed: Aug. 13, 2001

(65) Prior Publication Data

US 2002/0075719 A1 Jun. 20, 2002

Related U.S. Application Data

(63) Continuation-in-part of application No. 09/638,428, filed on Aug. 14, 2000.

(51) Int. Cl.$^7$ .............................................. G11C 11/00
(52) U.S. Cl. .................... 365/130; 365/225.7; 365/113; 365/105
(58) Field of Search .............................. 365/225.7, 113, 365/105, 130

(56) References Cited

U.S. PATENT DOCUMENTS

| | | |
|---|---|---|
| 4,272,880 A | 6/1981 | Pashley |
| 4,442,507 A | 4/1984 | Roesner |
| 4,489,478 A | 12/1984 | Sakurai |
| 4,498,226 A | 2/1985 | Inoue et al. |
| 4,499,557 A | 2/1985 | Holmberg et al. |
| 4,646,266 A | 2/1987 | Ovshinsky et al. |
| 4,677,742 A | 7/1987 | Johnson |
| 5,070,384 A | 12/1991 | McCollum et al. |
| 5,306,935 A | 4/1994 | Esquivel et al. |
| 5,427,979 A | 6/1995 | Chang |

(List continued on next page.)

FOREIGN PATENT DOCUMENTS

WO     WO 99/14763     3/1999

OTHER PUBLICATIONS

Douglas, John H., "*The Route To 3–D Chips*", High Technology, Sep. 1983, vol. 3, No. 9, pp. 55–59.
Edited by Cappelletti, Paulo et al., "*Flash Memories*", Kluwer Academic Publishers, 1999.
Kawashima, Shoichiro et al., "*A Charge–Transfer Amplifier and an Encoded–Bus Architecture for Low–Power SRAM's*", IEE Journal of Solid–State Circuits, vol. 33, No. 5, May 1998, pp. 793–799.
Zhang, Ph.D., Guobiao, "*Three–Dimensional Read–Only Memory (3D–ROM)*", presentation from website zhangpatents, pp. 1–29.
Zhang, Ph.D., Guobiao, "*3D–ROM—A First Practical Step Towards 3D–IC*" Semiconductor International, Jul. 2000, from website zhangpatents, pp. 1–7.

*Primary Examiner*—Huan Hoang
(74) *Attorney, Agent, or Firm*—Brinks Hofer Gilson & Lione

(57) ABSTRACT

A low-cost memory cell array includes multiple, vertically-stacked layers of memory cells. In one form, each memory cell is characterized by a small cross-sectional area and a read current less than 6.3 microamperes. The resulting memory array has a slow access time and is well-suited for digital media storage, where access time requirements are low and the dramatic cost reductions associated with the disclosed memory arrays are particularly attractive. In another form, each memory cell includes an antifuse layer and diode components, wherein at least one diode component is heavily doped (to a dopant concentration greater than $10^{19}$/cm$^3$), and wherein the read current is large (up to 500 mA).

75 Claims, 3 Drawing Sheets

U.S. PATENT DOCUMENTS

| | | |
|---|---|---|
| 5,441,907 A | 8/1995 | Sung et al. |
| 5,535,156 A | 7/1996 | Levy et al. |
| 5,602,987 A | 2/1997 | Harari et al. |
| 5,640,343 A | 6/1997 | Gallagher et al. |
| 5,745,407 A | 4/1998 | Levy et al. |
| 5,835,396 A | 11/1998 | Zhang |
| 6,034,882 A | 3/2000 | Johnson et al. |
| 6,236,587 B1 | 5/2001 | Gudesen et al. |
| 2002/0027822 A1 * | 3/2002 | Candelier et al. ........ 365/225.7 |

* cited by examiner

LOW COST THREE-DIMENSIONAL MEMORY ARRAY

CROSS REFERENCE TO RELATED APPLICATION

This application is a continuation-in-part of copending U.S. patent application Ser. No. 09/638,428, filed Aug. 14, 2000, the entirety of which is hereby incorporated by reference.

BACKGROUND

This invention relates to three-dimensional memory arrays of the type that include multiple vertically-stacked layers of memory cells, and in particular to such memory arrays that are particularly low in manufacturing cost.

The marketplace is demanding memory chips containing an ever-larger number of storage bits, at an ever-lower cost per bit. It is extremely desirable to provide a high-capacity memory at a very low cost, to serve this expanding market.

Conventional memory design assumes that high-speed read access is an important goal. The basic memory cell is conventionally designed to provide a relatively large read current, ensuring a relatively fast read access. Unfortunately, to produce these relatively large read currents, relatively large switching devices are needed, and the large devices give rise to relatively large memory cells. Large memory cells cause the memory chip area to be large, which means the memory chip cost will be high (since the cost increases as the area grows).

For example, as described by P. Cappalletti, et al. (*Flash Memories,* Kluwer Academic Publishers, Norwell, Mass., USA, Copyright 1999, ISBN 0-7923-8487-3), the typical read current of a conventional, two-dimensional flash memory cell array is 100 microamperes (page 42), and the worst-case read current in such an array could range from 1 to 5 microamperes (page 308).

Similarly, S. Kawashima, et al. ("A Charge-Transfer Amplifier and an Encoded-Bus Architecture for Low-Power SRAMS," IEEE Journal of Solid-State Circuits, Vol. 33, No. 5, May 1998, pp. 793–799) state that the read current for the described conventional SRAM two-dimensional memory cell array is 100 microamperes.

Vertically-stacked layers of memory cells have been described, as for example in U.S. Pat. No. 4,646,266 ("Ovshinsky"), U.S. Pat. No. 5,835,396 ("Zhang"), and U.S. Pat. No. 6,034,882 ("Johnson"), and PCT WO 99/14763 ("Gudesen"). Johnson and Zhang describe write-once memory arrays, while Ovshinsky and Gudesen describe re-writable memory arrays; however, none of these documents suggests the present invention as defined by the following claims.

BRIEF SUMMARY

Preferred embodiments described below include a memory array comprising a plurality of vertically-stacked layers of memory cells, each memory cell characterized by a read current that is less than 6.3 microamperes.

Because the read current is relatively small, small memory cells occupying a small chip area may be used. In this way manufacturing costs are minimized. The disclosed memory arrays are well-suited for use in applications that can tolerate longer-than-conventional read access times, and for which the dramatic cost reduction that is achieved is particularly attractive.

Other preferred embodiments described below include a three-dimensional memory array having multiple vertically stacked layers of memory cells, each memory cell having a respective antifuse layer. The memory cells are characterized by an average maximum read current of less than 500 microamperes when the respective antifuse layers are disrupted. The memory cells also include first and second diode components, each characterized by a dopant concentration greater than $10 \times 10^{19}/cm^3$. Boron dopant concentrations of $1 \times 10^{20}/cm^3$ and $5 \times 10^{20}/cm^3$ are disclosed. These high dopant levels provide the advantage of higher maximum read currents for a programmed memory cell.

This section has been provided by way of general introduction, and it is not intended to narrow the scope of the following claims.

DETAILED DESCRIPTION OF THE PRESENTLY PREFERRED EMBODIMENTS

Figure 1:
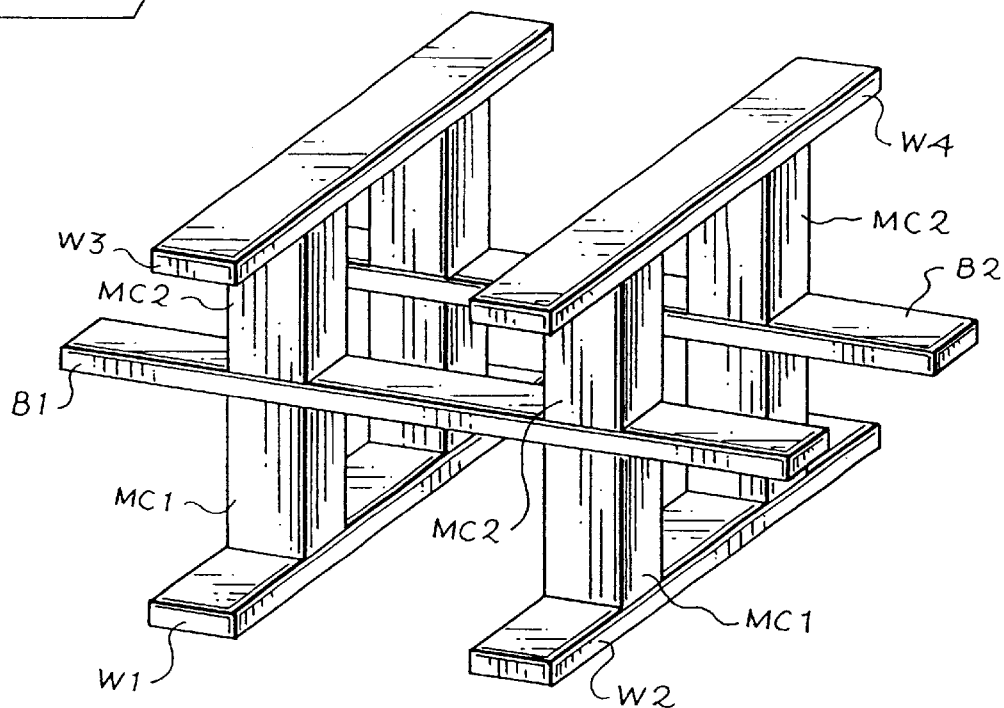
FIG. 1 is a schematic diagram of a 3-D memory array.

A low-cost, three-dimensional memory array is described. In the following description, numerous specific details are set forth such as specific materials and layer thicknesses. It will be apparent, however, to one skilled in the art that the present invention may be practiced without these details. In other instances, well-known circuits and fabrication techniques have not been set forth in detail in order not to unnecessarily obscure the present invention.

General Discussion

In the embodiments described below, memory cells are organized and built in three dimensions rather than two. There are several layers of memory cells, and the layers are vertically stacked above one another. The three dimensions are called "rows", "columns", and "layers". Typically, the rows and columns are generally parallel to the upper surface of an underlying substrate, and the layers are separated from one another along a direction perpendicular to the upper surface of the underlying substrate.

Some memory cells contain an element which protrudes either upwardly or downwardly, and have in the past been referred to as a "three dimensional memory cell". However these memory cells are arrayed in a conventional two-dimensional array. This is quite different from the embodiments described below, which include a three-dimensional array of memory cells, with several layers of memory cells stacked vertically above one another.

A significant feature of these embodiments is that they explicitly decrease memory operating speed, in exchange for low cost, three-dimensional organization. These embodiments use very small switching devices, giving a small memory cell and a small total chip area. The small switching devices also give a small read current, which makes the read access time relatively slow. However, there are several important memory applications which can easily tolerate a slow access time, and which derive tremendous benefit from dramatically lower memory cost. Many of these low-speed applications may be collected together under the name "digital media storage" and include the following: digital storage of still pictures (photographs), digital storage of music and digital audio in general, digital books, digital storage of maps, sequences of images including digital video, and numerous other examples which will be readily apparent to those skilled in the art. Digital media storage applications can be considered as storage applications by means of which copyrightable material may be fixed in a tangible medium of expression. For such applications, re-writability of the storage medium is not an asset, and in fact can even be undesirable. For example, it may be important to have an unambiguous and immutable record of the expressed material. Moreover, cost is generally lower for write-once than for re-writable memory devices.

The memory array of the embodiments described below includes a vertical stack of multiple layers of memory cells, and the memory cell may take any desired form; memory cells taught in Zhang U.S. Pat. No. 5,835,396, Johnson U.S. Pat. No. 6,034,882, Knall U.S. patent application Ser. No. 09/560,626, and U.S. patent application Ser. No. 09/928,536 (assigned to the assignee of record and hereby incorporated by reference), may be taken as examples. However the preferred embodiments described below have been designed to minimize cost, and the memory cells are therefore as small as possible.

To make the memory cells small, fine-pitch photolithography is used to pattern the geometric shapes of the memory cells. In particular, the wordlines and bitlines are formed with a linewidth no larger than approximately 1 micron, and a line-to-line spacing no larger than about 1 micron. These values of F (the photolithographic featuresize) may be treated as maximum values; it is preferable that the linewidth and spacing be smaller than approximately 0.25 microns.

FIG. 1 shows a schematic representation of one embodiment of a memory array of the type described above. Each of the memory cells MC1, MC2 is a two-terminal cell that includes a state storage element. In this embodiment, the memory cells MC1 are arranged at a first level, and the memory cells MC2 are arranged at a second level that is vertically stacked with respect to the first level. The terminals of the memory cells MC1, MC2 are disposed at the respective ends of the cell. In this connection, the term "terminal" is intended broadly, and a terminal may be embodied simply as a terminal portion of the cell, or as a separate layer of the cell.

Each of the terminals of each of the memory cells MC1, MC2 is in electrical contact with a respective conductor or wire. The conductors W1, W2 at the bottom of the memory cells MC1 in the view of FIG. 1 are configured as wordlines, and the conductors B1, B2 connected to the upper terminals of the memory cells MC1 are configured as bitlines, which in this embodiment run substantially perpendicularly to the wordlines W1, W2. Thus, each of the memory cells MC1 bridges a selected one of the wordlines W1, W2 and a selected one of the bitlines B1, B2.

Similarly, the memory cells MC2 of the second layer are connected between selected ones of the bitlines B1, B2 and selected wordlines W3, W4. The wordlines W3, W4 in this embodiment are disposed on another level, vertically stacked above the level of the bitlines B1, B2.

The memory cell array of FIG. 1 can be similar in basic geometry and materials to that described in FIGS. 6a through 6g of the above-identified Johnson patent. The Johnson patent, which is assigned to the assignee of the present invention, is hereby incorporated by reference in its entirety.

For embodiments in which the basic cell size in plan view is 2 F by 2 F (such as taught by the above-identified Johnson or Knall patent documents), the pitch of the memory cell (the total width of 100 adjacent cells, divided by 100) is preferably no larger than about 0.50 microns (and generally no larger than 2 microns) in either the wordline or bitline direction, and the total area consumed by a memory cell is preferably no larger than approximately 0.25 square microns. The chip area consumed is then approximately <0.25 square millimeters per million bits on each layer of the vertical stack. Stating the same result another way, the packing density is >4 million bits per square millimeter on each layer of the vertical stack.

Vertical stacking increases density and decreases chip area for a given size of a memory array; in a preferred embodiment having eight layers of memory cells vertically stacked above one another, the density is >32 million bits per square millimeter of chip area.

As fine-pitch lithography improves, the density of these memory cells improves as well. The following equation shows the packing density in bits per unit area, for a lithography generation whose featuresize is F and for a vertical stack of N layers of 2 F by 2 F cells:

packing density=$N/4\ F^2$.

It should be noted that other, less densely packed, embodiments of the present invention can use memory cells that are larger than 2 F by 2 F (see, e.g. the memory cell shown in FIG. 6B of the above-identified Zhang patent). These larger memory cells result in a larger chip area and are thus less desirable.

Unfortunately, very small memory cells (which are extremely desirable because of their very high packing density) have a drawback: their read current must flow through a very small cross-sectional area, and consequently the magnitude of the read current is quite small. This makes the memory cell slow.

If the wordlines and the bitlines of FIG. 1 are patterned at 0.25 microns wide (or less), then the read current of a two-terminal cell such as that described in the above-identified Johnson patent must flow through an area of A=0.25 microns×0.25 microns=$6.25 \times 10^{-10}$ cm$^2$. The magnitude of the read current ($I_{RD}$) is given by the product of the current density ($J_{RD}$) and the cross-sectional area (A):

$$I_{RD}=J_{RD} \times A.$$

In carrying out one embodiment of our invention, the largest value of memory cell current density $J_{RD}$ that we have observed in our laboratory is $1 \times 10^4$ A/cm$^2$. Even at this maximum current density, the magnitude of the read current is relatively small: $I_{RD}$=6.25 microamperes. More typical values of $J_{RD}$ for various embodiments of the invention are $1 \times 10^2$ A/cm$^2$, giving $I_{RD}$=0.06 microamperes.

Figure 2:
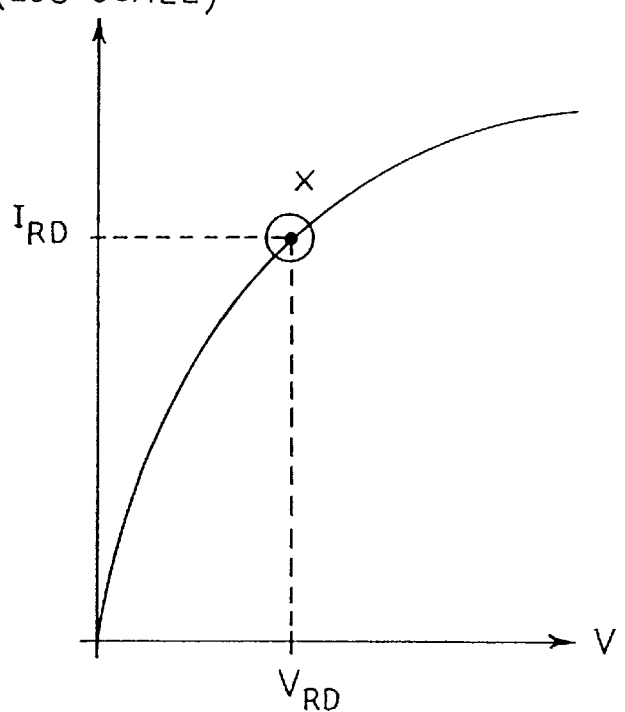
FIG. 2 is a graph of a current-voltage curve associated with a memory cell in the memory array of FIG. 1.

A two-terminal memory cell may be characterized by its current-versus-voltage curve. FIG. 2 shows the current-versus-voltage curve of a programmed two-terminal memory cell such as the one shown in FIG. 1. As the voltage across the cell increases, the current through the cell also increases. The memory designer chooses a specific point on this I-V curve as the operating point of the memory cell during a read operation; this point is labelled "X" in FIG. 1. As shown, the operating point is at a read voltage "$V_{RD}$" and a read current "$I_{RD}$".

The memory designer will also choose a read operating point for a memory cell having three or more terminals; the important characteristic of the operating point is the selected read current, $I_{RD}$. Whether the cell has two terminals, or more than two terminals, the read current has a direct impact on the memory speed.

To the first order, memory speed can be approximated by the bitline delay. Bitline delay is determined by memory cell read current $I_{RD}$, bitline swing $\Delta V_B$, and bitline capacitance $C_B$:

bitline delay=$C_B \Delta V_B / I_{RD}$.

Typical values are $C_B$=1.0 picoFarad, $\Delta V_B$=0.3 volts. If $I_{RD}$ were 6.25 microamperes (corresponding to the highest value of current density experimentally observed and thus giving an estimate of the smallest delay), the bitline delay would be 48 nanoseconds. If $I_{RD}$ were 62.5 nanoamperes (corresponding to values of current density that are typically observed in various embodiments), the bitline delay would be 4.8 microseconds.

With estimated read access times of 48 nanoseconds to 4.8 microseconds, these memories are quite slow. Conventional two-dimensional semiconductor memories, such as DRAMs, SRAMs, ROMs, EEPROMs, and Flash memories usually have read access times between 10 and 120 nanoseconds. However, conventional semiconductor memories are still using two-dimensional arrays and are still using large memory cells with large read currents. They achieve their fast access time at the expense of large chip area and hence high chip cost. By contrast, the embodiment of FIG. 1 has a three-dimensional array of very small memory cells, having a small read current and a slow access time.

The slow access time of this embodiment is perfectly adequate for many digital media storage applications. For example, uncompressed digital audio (16 bit PCM, 2 channels, 44.1 kHz sampling) requires 16 bits every 11.34 microseconds; if the memory is internally organized with a 32-bit data bus (in which 32 bits are read in parallel in each read cycle), the required read bandwidth can be achieved when the random-address access time is as slow as 22 microseconds. The embodiment of FIG. 1, with a bitline delay of 4.8 microseconds, is more than amply fast for this application. Compressed digital audio such as MP3 requires a mere 8 bits per 56 microseconds, which is comfortably slower than the bitline delay of this embodiment.

The speed requirements of digital image storage are similarly modest. A high-resolution, 3-megapixel image, compressed with JPEG, requires about 1.6 megabytes of storage. To read this file in 0.5 seconds requires a read bandwidth of 3.2 megabytes per second. If the memory is internally organized with a 128-bit data bus, then it fetches 16 bytes (128 bits) every 4.8 microseconds, and has a read bandwidth of 3.3 megabytes per second. Again, the slow access time of the embodiment of FIG. 1 is nevertheless adequate for the application.

In a preferred embodiment of the present invention, each memory cell MC1, MC2 cell has two terminals, the read voltage $V_{RD}$ is approximately 2 volts, and the corresponding memory cell current $I_{RD}$ is 6.25 microamperes or less. With a read current this small, the bitline delay is quite long and the memory chip will be slower than a conventional memory. However, several digital media storage applications have been identified for which the slow speed is not a drawback, and for which the dramatically lower cost is a strong benefit. These include "digital books" (fiction and nonfiction texts stored electronically), electronically stored maps, digital video, digitally stored photographs, digital audio, and others.

Figure 4:
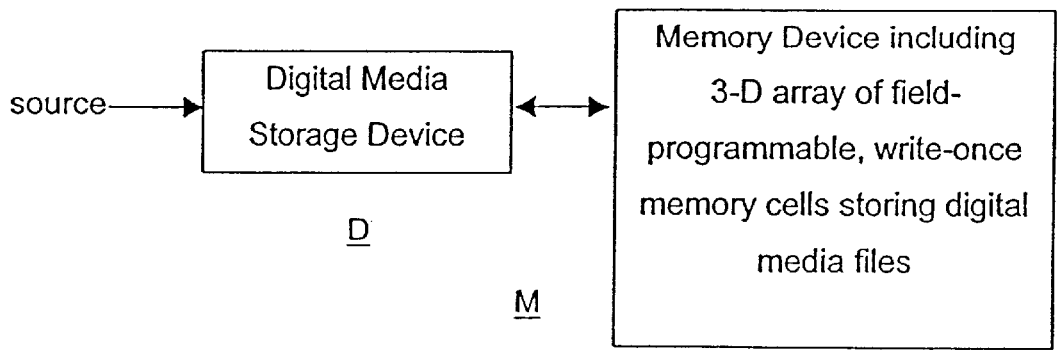
FIG. 4 is a block diagram of a digital media storage device connected to a memory device.

One preferred embodiment comprises field-programmable, write-once memory cells used as a digital media storage device. FIG. 4 shows a block diagram of such an embodiment, including a digital media storage device D and a memory device M. In this example, the digital media storage device is a consumer device such as a digital audio player, a digital camera, or a digital book. The memory device is a modular, hand-held unit having an exposed electrical connector at one edge such that the memory device M can readily be installed in the storage device D and removed therefrom. The memory device D preferably includes a three-dimensional array of field-programmable, write-once memory cells of the type described herein. This provides the advantage of an extremely low cost, write-once memory array that can be used to store digital media files of the type described above.

For example, the storage device D may receive digital media files from a source such as a network (e.g. the Internet) or another computer such as a collection of digital media files at a retail outlet. The storage device D receives downloaded digital media files from the source, and writes the downloaded digital media files into the field-programmable, write-once memory cells of the memory device 10. As used herein the term "field-programmable" refers to memory devices that can be written into at the command of a consumer, as for example when it is desired to load a new digital media file into the memory device. In some cases, the memory device of this invention may be field programmed directly by the source of digital media files, rather than by the storage device described above.

The memory device M and the storage device D may be constructed as described in U.S. patent application Ser. Nos. 09/638,439, 09/638,427 and 09/638,334, all three of which are filed on the same date as the present application, are assigned to the assignee of the present application, and are hereby incorporated by reference in their entirety.

Best Mode Details

Figure 3:
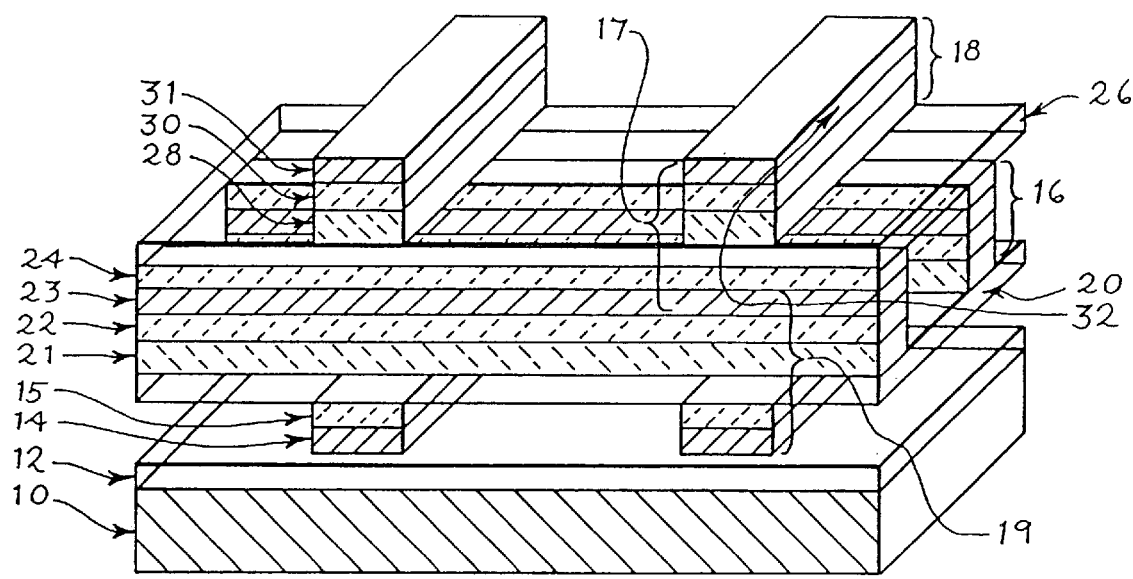
FIG. 3 is a schematic diagram of a 3-D memory array that incorporates a preferred embodiment of this invention.

FIG. 3 relates to a presently preferred embodiment, which may have eight levels of memory cells. Each level includes a first plurality of parallel spaced-apart rail-stacks running in a first direction and a second plurality of rail-stacks or conductors (depending on the embodiment) running in a second direction. Generally, the first rail-stacks run perpendicular to the second conductors/rail-stacks and hence form a right angle at their intersections.

As will be seen, a bit is stored at each of the intersections of rail-stacks. However, there are no physically discrete individual memory cells at the intersections, rather memory cells are defined by the rail-stacks and intermediate layers. This makes it easier to fabricate the memory array. The term "memory cell" is intended broadly to encompass physically discrete elements (e.g. FIG. 1), or elements that are defined by rail-stacks and intermediate layers (e.g. FIG. 3), or any other localized region where a bit can be stored. When the array is fabricated all the bits are in the zero (or one) state and after programming, the programmed bits are in the one (or zero) state.

In the embodiment of FIG. 3, several rail-stacks are illustrated in the partial cross-section of the array. For instance, a rail-stack 16 is shown at one height and a half rail-stack 18 is shown at a second height above the first height. Also, half rail-stacks are disposed between rail-stack 16 and a substrate 10. These lower rail-stacks run in the same direction as the half rail-stack 18. A bit is stored at the intersection of rail-stacks and, for instance, a "cell" is present between the rail-stacks as shown within the bracket 17 and another within the bracket 19. Each of these brackets spans a memory level.

The array is fabricated on a substrate 10, which may be an ordinary monocrystalline silicon substrate. Decoding circuitry, sensing circuits, and programming circuits are fabricated in one embodiment within the substrate under the memory array using, for instance, ordinary MOS fabrication techniques. (These circuits may also be fabricated above the substrate.) Vias are used to connect conductors within the rail-stacks to the substrates to allow access to each rail-stack in order to program data into the array and to read data from the array. For instance, the circuitry within the substrate 10 may select the rail-stack 16 and the rail stack 18 to program or to read a bit associated with the intersection of these rail-stacks.

As shown in FIG. 3, an insulating layer 12 is formed over the substrate in order that the array may be fabricated above the substrate. This layer may be planarized with, for instance, chemical-mechanical polishing (CMP) to provide a flat surface upon which the array may be fabricated.

Following this, a conductive layer 14 is formed on the substrate. As will be seen, conductive layers are used within the rail-stacks and these layers and the resultant conductors may be fabricated from elemental metals such as tungsten, tantalum, aluminum, copper or metal alloys such as MoW. Metal silicides may also be used such as $TiSi_2$, $CoSi_2$ or a conductive compound such as TiN, WC may be used. A highly doped semiconductor layer such as silicon is also suitable. Multiple layer structures may be used selecting one or more of the above.

Following the deposition of a conductive layer, a layer of semiconductor material (layer 15) such as silicon is formed over the conductive layer. This is typically a polysilicon layer; however, an amorphous layer may be used. Other semiconductor materials may be used such as Ge, GaAs, etc. In the embodiment of FIG. 3, this semiconductor layer is highly doped and, as will be seen, forms one-half a diode. After masking and etching steps, half rail-stacks are formed. These rail-stacks are "half" or partial rail-stacks since they are approximately half the thickness of the rail-stacks used in the next level.

Following this, in the embodiment of FIG. 3, a material for the antifuses used to program the array is deposited. In one embodiment, the layer 20 is a dielectric such as silicon dioxide which is deposited by chemical vapor deposition (CVD) in a blanket deposition over the half rail-stacks and a dielectric fill, filling the space between the rail-stacks. In another embodiment the layer 20 is grown on the upper surface of the silicon layer 15 and only exists on the rail-stacks.

Now a full set of memory array rail-stacks is formed on the layer 20. This comprises first the deposition of a lightly doped silicon layer 21 doped with a conductivity-type dopant opposite to that used for the silicon layer 15, a heavily doped silicon layer 22 doped also opposite to the layer 15, a conductive layer 23 and a heavily doped silicon layer 24 doped with the same conductivity-type dopant as layers 21 and 22. After masking and etching, the rail-stacks shown in FIG. 3, such as rail-stack 16, are formed. These rail-stacks are oriented, as illustrated, in a direction perpendicular to the rail-stacks above and below them.

While not shown in FIG. 3, the spaces between the rail-stacks are filled with a dielectric such as silicon dioxide. Then the rail-stacks and fill are planarized by CMP. In another embodiment spin-on-glass (SOG) is used to fill the voids. In this case chemical planarization can be used. Other fill and planarization methods can be used.

After formation of the rail-stacks another antifuse layer 26 is formed, for instance from a dielectric such as silicon dioxide, silicon nitride, silicon oxynitride, amorphous carbon or other insulating materials or combinations of materials. (Also an updoped layer of silicon may be used for the antifuse layer.)

Now another layer of rail-stacks is defined and only half rail-stacks are shown in FIG. 3 at this upper level. This half rail-stack comprises a silicon layer 28 doped with a conductivity-type dopant opposite to that of layer 24. This is a lightly doped layer. Another silicon layer 30 is formed on layer 28 and this layer is doped with the same conductivity-type dopant as layer 28; however, it is more heavily doped. Then a conductive layer 31 is formed above the layer 30.

Half rail-stacks are used at the very upper-most level of the array and at the very lowest level of the array. In between the half rail-stacks, full rail-stacks, such as rail-stack 16, are used throughout the array.

It should be noted that the silicon layers disposed on the conductive layers extend the entire length of the rail-stacks in the embodiment of FIG. 3 and are uninterrupted, except possibly where vias are used to provide a conductive path to the substrate 10.

In FIG. 3 a path 32 is illustrated from a lower conductor in level 17 to an upper conductor in this level found in the rail-stack 18. This path is accessed in one embodiment through decoding circuitry in the substrate for both programming and reading of data into and from the array for one bit.

For instance, to program the bit, a relatively high voltage, e.g. 5–20V, is applied between the conductors to forward-bias the diode between these conductors. This relatively high voltage causes a breach in the layer 26 creating a diode. Without this high voltage, the layer 26 remains an insulator. Thus, by selecting pairs of conductors, diodes can be selectively formed so as to program the array. While programming the array with the layers adjacent to the antifuse material being forward-biased is currently preferred, it is also possible to program using a reverse-biasing potential.

To sense the data programmed into the array, a voltage lower than the programming voltage is used. This lower voltage is applied so as to forward-bias the diode of the cell being accessed and thus allow a sense amplifier to determine whether or not the layer 26 is intact between the rail-stacks. Note that "sneak" or parasitic paths in the array which would interfere with the sensing will include a reverse-biased diode.

A programmed cell will have a current-versus-voltage curve similar to the one shown FIG. 2, with $V_{RD}$ in the vicinity of 2 volts, $I_{RD}$ around 62.5 nanoamperes in the typical case (6.25 microamperes best case), and a read current density no greater than $1 \times 10^4$ amperes/cm$^2$. In this preferred embodiment, there are eight layers of memory cells stacked vertically.

Also, the anode and cathode of the diodes are reversed at each of the successive antifuse layers. This facilitates programming and sensing, since all of the conductors at each level are either bitlines or wordlines. And, for instance, conductors at one height will serve as bitlines for two levels and conductors at the next height serve as wordlines for two levels. This simplifies the decoding and sensing and more importantly reduces processing.

The basic structure of the memory array of FIG. 3 is closely related to that of the above-identified Knall U.S. patent application Ser. No. 09/560,626, assigned to the assignee of the present invention and hereby incorporated by reference in its entirety.

Alternative Embodiments

It is preferred to make the memory cell as small as possible, ideally achieving or beating a cell area of 4 $F^2$, where F is the lithographic featuresize. Examples of cells that might achieve this include the Johnson and Knall memory cells described above in connection with FIGS. 1 and 3, respectively. But the present invention is not limited to these examples, and many alternatives are possible. Other memory cells can be used in this invention, as long as they are vertically stackable and as long as their memory cell area is sufficiently small. To name one example, MRAM (magnetic RAM) cells as described in Gallagher U.S. Pat. No. 5,640,343 (hereby incorporated by reference in its entirety) can be vertically stacked. The memory cells described in U.S. patent applications Serg. No. 09/639,702 and Ser. No. 09/639,449 (filed on the same date as the present application, assigned to the assignee of the present invention, and hereby incorporated by reference in their entirety) are also suitable.

Memory cells which have only two terminals (a wordline terminal and a bitline terminal) are preferred, since these kinds of cells are usually easiest to realize in a cell area of 4 $F^2$. Examples of two-terminal memory cells are described in the above-identified Johnson, Zhang, Knall, Gallagher and Ovshinsky patent documents. However, memory cells that have more than two terminals are also suitable.

Memory cells comprised of semiconductor materials are preferred, such as those described in the above-identified Johnson, Knall, and Zhang patent documents. These memory cells are more easily manufactured in state-of-the-art factories having fine-pitch photolithography. However, memory cells that comprise other materials such as the phase change materials of the above-identified Ovshinsky patent, and organic materials such as those described in the above-identified Gudesen patent document are also suitable. The Ovshinsky and Gudesen patent documents are hereby incorporated by reference in their entirety. Memory cells comprising materials such as amorphous solids (see e.g. Ovshinsky U.S. Pat. No. 4,646,266) are also suitable.

3D memory arrays which are fabricated in layers, vertically stacked above a semiconductor substrate, and in particular a monocrystalline semiconductor substrate, are preferred. This makes it more straightforward to implement the input and output functions of the memory array, by using conventional semiconductor circuitry such as CMOS built in the substrate. Other substrates, including insulating substrates for example, are also suitable.

In the presently preferred embodiment, the lithographic feature size F is 0.25 microns or less. As the practical featuresize gets smaller, the cell read current will decrease, and access time will continue to be slow.

Conventional memory designs such as DRAMs have achieved a packing density of approximately $[1/8\ F^2)]$ bits per unit area, and conventional flash memories have achieved packing densities of $[1/4.4\ F^2]$ bits per unit area. However a preferred embodiment of the present invention has a packing density of approximately $[8/4.0\ F^2]$ bits per unit area, which is a factor of 16 better than conventional DRAM and a factor of 8.8 better than conventional flash memories. Since a large packing density produces a small chip area, and since chip cost is reduced when chip area is reduced, the memory arrays described above are dramatically lower cost than conventional memories such as DRAM and flash.

High Read Embodiments

Three-dimensional memory arrays of the type described above include vertically stacked layers of memory cells, each memory cell having a respective antifuse layer. The resistance of the memory cell is initially high when the antifuse layer is in its initial, intact form. However, when the memory cell is programmed by breaching or disrupting the antifuse layer, the resistance of the memory cell goes down substantially, and the associated read current for the programmed cell goes up.

The memory cells described above include two diode components that form a PN junction diode, and the maximum read current provided by a programmed memory cell has been found to vary strongly with the dopant concentration used for the diode components. In particular, the inventors have discovered that high dopant levels can provide maximum read currents for a programmed cell in excess of 200 microamperes and up to 500 microamperes. Such a high read current memory cell is described below in conjunction with FIG. 5. It should be understood that the high dopant levels described below can be used for other types of field-programmable, dielectric-antifuse memory cell, including memory cells of the general types described in U.S. patent application Ser. Nos. 09/928,536 and 09/897, 705, both of which are hereby incorporated by reference in their entirety.

Figure 5:
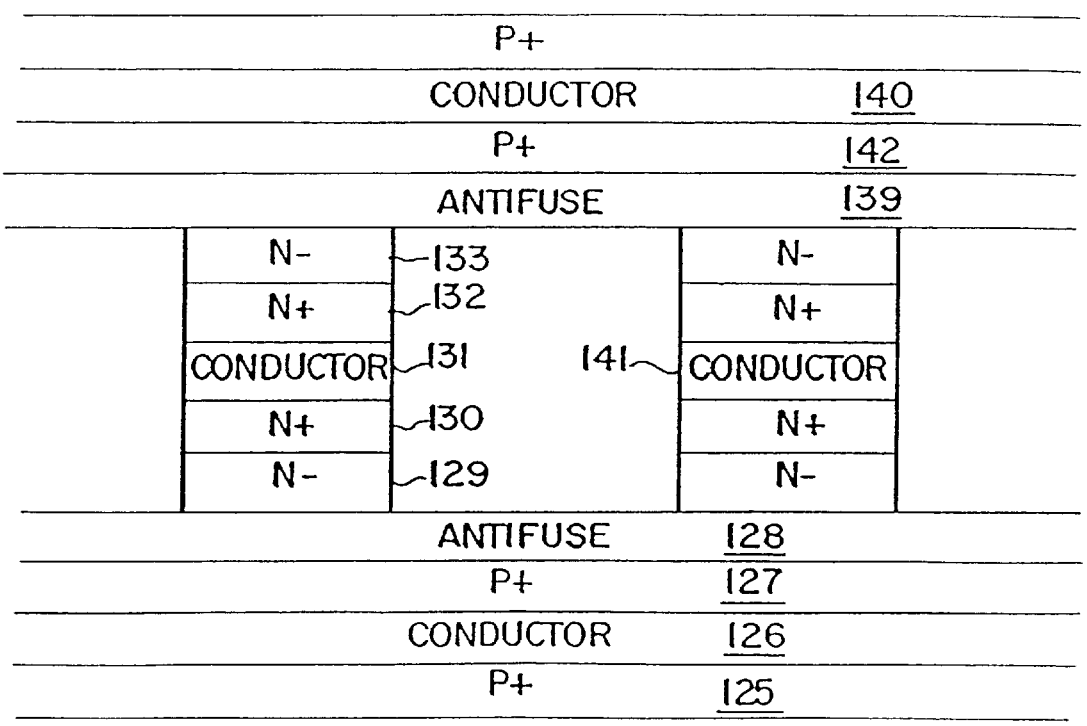
FIG. 5 is a schematic sectional view of a portion of a 3D memory array that incorporates another preferred embodiment of this invention.

In FIG. 5, the layers 126, 131 are conductors formed of titanium disilicide. Typically, these conductors will be oriented at right angles to one another, and the intervening layers 126, 127,129, 130 are positioned at least in the intersection between the conductive layers 126,131. In this example the layer 127 is heavily doped with boron at a dopant concentration of $3\times10^{20}/cm^2$ and the layer 130 is heavily doped with phosphorous at a dopant concentration of $1\times10^{20}/cm^2$. The layer 128 forms an antifuse layer of silicon dioxide, and the layer 129 is a polysilicon layer doped with phosphorous at a concentration of $1\times10^{17}/cm^2$. In this example the layers 127, 129, 130 correspond to diode components, in that they form a diode when the antifuse layer 128 is disrupted. Because the diode components formed by the layers 127 and 130 are heavily doped, the resulting memory cell exhibits an unusually high read current once the cell has been programmed by disrupting the antifuse layer 128. Even higher dopant concentrations can be used, and in alternatives the boron concentration in layer 127 is greater than $5\times10^{20}/cm^3$, and greater than $1\times10^{21}/cm^3$.

Preferably, the conductive layers 126, 131 are formed as described in copending U.S. patent application Ser. No. 09/928,975, the disclosure of which is hereby incorporated by reference. As described in greater detail in that application, a layer of undoped amorphous silicon is deposited over an underlying layer of heavily doped silicon, and a layer of titanium is deposited over the layer of undoped amorphous silicon. The thickness of the amorphous silicon layer is selected to be about 2.4 times the thickness of the titanium layer. The resulting semiconductor structure is then annealed at least two times, the first time at 600° C. for 60 seconds and the second time at 800° C. for 60 seconds. This approach has been found to produce low-resistivity titanium disilicide wires with a line width of 0.25 microns in a reliable manner.

Preferably, the antifuse layer 128 is formed as described in U.S. patent application Ser. No. 09/918,307, the disclosure of which is hereby incorporated by reference. In particular, the leakage current of the unprogrammed antifuse layer 128 is arranged to be comparable to the leakage current of the reverse biased diode components of the memory cell. This approach reduces unintended programming of the memory cell.

Table 1 provides preferred material parameters for one version of the semiconductor structure of FIG. 5.

TABLE 1

Preferred Material Parameters for the semiconductor structure of FIG. 6

| Layer | Material | Thickness (Å) | Dopant | Dopant Concentration (atoms/cm$^3$) |
|---|---|---|---|---|
| 125, 142 | poly Si | 1500 | Boron | >1 × 10$^{20}$ |
| 126, 131, 140, 141 | TiSi$_2$ | 500 | | |
| 127 | poly Si | 2000 | Boron | >3 × 10$^{20}$ |
| 128, 139 | SiO$_2$ | 25 | | |
| 129, 133 | poly Si | 2000 | Phosphorous | 1 × 10$^{17}$ |
| 130, 132 | poly Si | 500 | Phosphorous | >1 × 10$^{20}$ |

The high read current memory cell discussed above in conjunction with FIG. 5 can be used in substitution for the low read current memory cells discussed above.

Concluding Remarks

The foregoing detailed description has discussed only a few of the many forms that this invention can take. For this reason, this detailed description is intended by way of illustration and not limitation. It is only the following claims, including all equivalents, that are intended to define the scope of this invention.

We claim:

1. A 3-dimensional memory array comprising a plurality of vertically-stacked layers of memory cells, each memory cell comprising a respective antifuse layer, and said memory cells characterized by an average maximum read current less than 500 microamperes when the respective antifuse layers are breached.

2. The invention of claim 1 wherein said memory cells are characterized by a read voltage no greater than 2 volts.

3. The invention of claim 2 wherein the memory cells store digital media information selected from the group consisting of: digital text, digital books, digital music, digital audio, at least one digital still image, a sequence of digital images, digital video, at least one digital map, and combinations thereof.

4. The invention of claim 1 wherein each memory cell comprises exactly two terminals.

5. The invention of claim 4 wherein the memory cells store digital media information selected from the group consisting of: digital text, digital books, digital music, digital audio, at least one digital still image, a sequence of digital images, digital video, at least one digital map, and combinations thereof.

6. The invention of claim 1 wherein the memory array comprises a plurality of wires comprising wordlines and bitlines, and wherein each memory cell is connected to exactly two wires: the respective wordline and the respective bitline.

7. The invention of claim 6, wherein the memory cells store digital media information selected from the group consisting of: digital text, digital books, digital music, digital audio, at least one digital still image, a sequence of digital images, digital video, at least one digital map, and combinations thereof.

8. The invention of claim 1 wherein the memory cells comprise a semiconductor material.

9. The invention of claim 8 wherein the memory cells store digital media information selected from the group consisting of: digital text, digital books, digital music, digital audio, at least one digital still image, a sequence of digital images, digital video, at least one digital map, and combinations thereof.

10. The invention of claim 1 wherein the memory cells comprise an organic polymer.

11. The invention of claim 10, wherein the memory cells store digital media information selected from the group consisting of: digital text, digital books, digital music, digital audio, at least one digital still image, a sequence of digital images, digital video, at least one digital map, and combinations thereof.

12. The invention of claim 1 wherein the memory cells comprise a phase change material.

13. The invention of claim 12 wherein the memory cells store digital media information selected from the group consisting of: digital text, digital books, digital music, digital audio, at least one digital still image, a sequence of digital images, digital video, at least one digital map, and combinations thereof.

14. The invention of claim 1 wherein the memory cells comprise an amorphous solid.

15. The invention of claim 14 wherein the memory cells store digital media information selected from the group consisting of: digital text, digital books, digital music, digital audio, at least one digital still image, a sequence of digital images, digital video, at least one digital map, and combinations thereof.

16. The invention of claim 1 wherein the memory array further comprises a substrate, and wherein the memory cells are fabricated above the substrate.

17. The invention of claim 16 wherein the memory cells store digital media information selected from the group consisting of: digital text, digital books, digital music, digital audio, at least one digital still image, a sequence of digital images, digital video, at least one digital map, and combinations thereof.

18. The invention of claim 16 wherein the substrate comprises a semiconductor.

19. The invention of claim 18 wherein the memory cells store digital media information selected from the group consisting of: digital text, digital books, digital music, digital audio, at least one digital still image, a sequence of digital images, digital video, at least one digital map, and combinations thereof.

20. The invention of claim 1 wherein the memory array further comprises a substrate, and wherein the memory cells are arranged on the substrate at a density no less than $3 \times 10^7$ memory cells/mm$^2$ of substrate area.

21. The invention of claim 20 wherein the memory cells store digital media information selected from the group consisting of: digital text, digital books, digital music, digital audio, at least one digital still image, a sequence of digital images, digital video, at least one digital map, and combinations thereof.

22. The invention of claim 1 wherein said memory cells are characterized by an average maximum read current density no greater than $1 \times 10^4$ amperes/cm$^2$.

23. The invention of claim 22 wherein the memory cells store digital media information selected from the group consisting of: digital text, digital books, digital music, digital audio, at least one digital still image, a sequence of digital images, digital video, at least one digital map, and combinations thereof.

24. The invention of claim 1 wherein the memory cells store digital media information selected from the group consisting of: digital text, digital books, digital music, digital audio, at least one digital still image, a sequence of digital images, digital video, at least one digital map, and combinations thereof.

25. The invention of claim 24 in combination with a digital media storage device, said storage device operative to store said digital media information in said memory cells.

26. The invention of claim 25 wherein said storage device comprises a digital camera.

27. The invention of claim 25 wherein said storage device comprises a digital audio playback device.

28. The invention of claim 25 wherein said storage device comprises digital audio book.

29. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory cells are arranged in a plurality of vertically-stacked layers of memory cells.

30. The invention of claim 1 wherein the memory cells, when the respective antifuse layers are breached, are characterized by an average read current less than 6.3 microamperes; and wherein the memory cells, when the respective antifuse layers are intact, are characterized by an average read current less than the read current when the antifuse layer is breached.

31. The invention of claim 1 wherein each cell comprises a programmed state, in which the read current is less than 6.3 microamperes, and another state, in which the read current is less than in the programmed state.

32. The invention of claim 1 wherein each memory cell comprises a p-type semiconductor region characterized by a dopant concentration greater than $1\times10^{19}/cm^3$.

33. The invention of claim 1 wherein each memory cell comprises a p-type semiconductor region characterized by a dopant concentration greater than $1\times10^{20}/cm^3$.

34. The invention of claim 1 wherein each memory cell comprises a p-type semiconductor region characterized by a dopant concentration of at least $5\times10^{20}/cm^3$.

35. The invention of claim 1 wherein each memory cell comprises a p-type semiconductor doped with boron and characterized by a boron concentration greater than $1\times10^{19}/cm^3$.

36. The invention of claim 1 wherein each memory cell comprises a p-type semiconductor doped with boron and characterized by a boron concentration greater than $1\times10^{20}/cm^3$.

37. The invention of claim 1 wherein each memory cell comprises a p-type semiconductor doped with boron and characterized by a boron concentration greater than $5\times10^{20}/cm^3$.

38. The invention of claim 1 wherein the memory cells are characterized by an average maximum read current less than 6.3 microamperes.

39. The invention of claim 1 wherein the memory cells are characterized by an average maximum read current less than 125 microamperes.

40. The invention of claim 1 wherein the memory cells are characterized by an average maximum read current less than 250 microamperes.

41. The invention of claim 1 wherein each memory cell further comprises first and second diode components, at least one of the diode components comprising a semiconductor region comprising a dopant at a concentration greater than $1\times10^{19}/cm^3$.

42. The invention of claim 41 wherein the dopant is boron.

43. The invention of claim 41 wherein the dopant is a p-type dopant.

44. The invention of claim 41 wherein the antifuse layer is disposed between the first and second diode components.

45. The invention of claim 44 wherein the antifuse layer is in intimate contact with both of the diode components.

46. A memory array comprising a plurality of write-once, field programmable memory cells, each memory cell comprising a respective antifuse layer, and said memory cells characterized by an average maximum read current less than 500 microamperes when the respective antifuse layers are breached, said memory cells storing digital media, wherein said memory cells are characterized by a read voltage no greater than 2 volts.

47. The invention of claim 46 wherein the memory cells store digital media information selected from the group consisting of: digital text, digital books, digital music, digital audio, at least one digital still image, a sequence of digital images, digital video, at least one digital map, and combinations thereof.

48. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein each memory cell comprises exactly two terminals.

49. The invention of claim 48 wherein the memory cells store digital media information selected from the group consisting of: digital text, digital books, digital music, digital audio, at least one digital still image, a sequence of digital images, digital video, at least one digital map, and combinations thereof.

50. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory array comprises a plurality of wires comprising wordlines and bitlines, and wherein each memory cell is connected to exactly two wires: the respective wordline and the respective bitline.

51. The invention of claim 50 wherein the memory cells store digital media information selected from the group consisting of: digital text, digital books, digital music, digital audio, at least one digital still image, a sequence of digital images, digital video, at least one digital map, and combinations thereof.

52. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory cells comprise a semiconductor material and wherein the memory cells store digital media information selected from the group consisting of: digital text, digital books, digital music, digital audio, at least one digital still image, a sequence of digital images, digital video, at least one digital map, and combinations thereof.

53. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory cells comprise one of the following: an organic polymer, a phase change material, and an amorphous solid.

54. The invention of claim 53 wherein the memory cells store digital media information selected from the group consisting of: digital text, digital books, digital music, digital audio, at least one digital still image, a sequence of digital images, digital video, at least one digital map, and combinations thereof.

55. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory array further comprises a substrate, and wherein the memory cells are fabricated above the substrate, and wherein the memory cells store digital media information selected from the group consisting of: digital text, digital books, digital music, digital audio, at least one digital still image, a sequence of digital images, digital video, at least one digital map, and combinations thereof.

56. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory array further comprises a substrate, and wherein the memory cells are fabricated above the substrate, wherein the substrate comprises a semiconductor, and wherein the memory cells store digital media information selected from the group consisting of: digital text, digital books, digital music, digital audio, at least one digital still image, a sequence of digital images, digital video, at least one digital map, and combinations thereof.

57. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory array further comprises a substrate, and wherein the memory cells are arranged on the substrate at a density no less than $3 \times 10^7$ memory cells/mm$^2$ of substrate area.

58. The invention of claim 57 wherein the memory cells store digital media information selected from the group consisting of: digital text, digital books, digital music, digital audio, at least one digital still image, a sequence of digital images, digital video, at least one digital map, and combinations thereof.

59. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein said memory cells are characterized by an average maximum read current density no greater than $1 \times 10^4$ amperes/cm$^2$.

60. The invention of claim 59 wherein the memory cells store digital media information selected from the group consisting of: digital text, digital books, digital music, digital audio, at least one digital still image, a sequence of digital images, digital video, at least one digital map, and combinations thereof.

61. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory cells store digital media information selected from the group consisting of: digital text, digital books, digital music, digital audio, at least one digital still image, a sequence of digital images, digital video, at least one digital map, and combinations thereof.

62. The invention of claim 61 in combination with a digital media storage device, said storage device operative to store said digital media information in said memory cells.

63. The invention of claim 62 wherein said storage device comprises one of the following: a digital camera, a digital audio playback device, and a digital audio book.

64. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein the memory cells, when the respective antifuse layers are breached, are characterized by an average read current less than 6.3 microamperes; and wherein the memory cells, when the respective antifuse layers are intact, are characterized by an average read current less than the read current when the antifuse layer is breached.

65. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein each cell comprises a programmed state, in which the read current is less than 6.3 microamperes, and another state, in which the read current is less than in the programmed state.

66. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein each memory cell comprises a p-type semiconductor region characterized by a dopant concentration greater than $1 \times 10^{19}$/cm$^3$.

67. The invention of claim 66, wherein each memory cell comprises a p-type semiconductor region characterized by a dopant concentration greater than $1 \times 10^{20}$/cm$^3$.

68. The invention of claim 66, wherein each memory cell comprises a p-type semiconductor region characterized by a dopant concentration of at least $5 \times 10^{20}$/cm$^3$.

69. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein each memory cell comprises a p-type semiconductor doped with boron and characterized by a boron concentration greater than $1 \times 10^{19}$/cm$^3$.

70. The invention of claim 69, wherein each memory cell comprises a p-type semiconductor doped with boron and characterized by a boron concentration greater than $1 \times 10^{20}$/cm$^3$.

71. The invention of claim 69, wherein each memory cell comprises a p-type semiconductor doped with boron and characterized by a boron concentration greater than $5 \times 10^{20}$/cm$^3$.

72. A memory array comprising a plurality of write-once, field-programmable memory cells, each memory cell comprising a respective antifuse layer, and said memory cells characterized by an average maximum read current less than 500 microamperes when the respective antifuse layers are breached, said memory cells storing digital media, wherein each memory cell further comprises first and second diode components, at least one of the diode components comprising a semiconductor region comprising a dopant at a concentration greater than $1 \times 10^{19}/cm^3$.

73. The invention of claim 72 wherein the dopant is one of the following: boron and a p-type dopant.

74. The invention of claim 72 wherein the antifuse layer is disposed between the first and second diode components.

75. The invention of claim 74 wherein the antifuse layer is in intimate contact with both of the diode components.

* * * * *